（12) United States Patent
Messere et al.

(10) Patent No.: US 8,044,415 B2
(45) Date of Patent: Oct. 25, 2011

(54) LIGHTING STRUCTURE COMPRISING AT LEAST ONE LIGHT-EMITTING DIODE, METHOD FOR MAKING SAME AND USES THEREOF

(75) Inventors: Rino Messere, Modave (BE); Philippe Armand, Paris (FR)

(73) Assignee: Saint-Gobain Glass France, Courbevoie (FR)

( * ) Notice: Subject to any disclaimer, the term of this patent is extended or adjusted under 35 U.S.C. 154(b) by 447 days.

(21) Appl. No.: 12/090,601

(22) PCT Filed: Oct. 10, 2006

(86) PCT No.: PCT/FR2006/051008
§ 371 (c)(1),
(2), (4) Date: Sep. 24, 2008

(87) PCT Pub. No.: WO2007/045786
PCT Pub. Date: Apr. 26, 2007

(65) Prior Publication Data
US 2009/0114928 A1 May 7, 2009

(30) Foreign Application Priority Data
Oct. 21, 2005 (FR) ...................................... 05 53211

(51) Int. Cl.
*H01L 29/18* (2006.01)
(52) U.S. Cl. ..................... 257/88; 257/99; 257/E33.057; 257/E33.066; 257/92; 438/28; 438/34; 362/545; 362/249.02

(58) Field of Classification Search .................... None
See application file for complete search history.

(56) References Cited

U.S. PATENT DOCUMENTS

| | | | |
|---|---|---|---|
| 6,087,680 A * | 7/2000 | Gramann et al. | 257/91 |
| 2003/0122482 A1* | 7/2003 | Yamanaka et al. | 313/512 |
| 2005/0212406 A1* | 9/2005 | Daniels et al. | 313/503 |
| 2006/0083945 A1* | 4/2006 | Morishita et al. | 428/690 |

FOREIGN PATENT DOCUMENTS

| | | |
|---|---|---|
| EP | 1 346 822 | 9/2003 |
| WO | 01 82378 | 11/2001 |
| WO | 2004 062908 | 7/2004 |
| WO | 2006 018066 | 2/2006 |

* cited by examiner

*Primary Examiner* — Minh-Loan T Tran
*Assistant Examiner* — Fei Fei Yeung Lopez
(74) *Attorney, Agent, or Firm* — Oblon, Spivak, McClelland, Maier & Neustadt, L.L.P.

(57) ABSTRACT

A luminous structure based on light-emitting diodes, which includes: a first dielectric element with a substantially plane main face associated with a first electrode; a second dielectric element with a substantially plane main face associated with a second electrode that faces the first electrode and lies in a different plane; at least a first light-emitting diode including a semiconductor chip including, on first and second opposed faces, first and second electrical contacts, the first electrical contact being electrically connected to the first electrode, the second electrical contact being electrically connected to the second electrode, and at least the first element at least partly transmitting radiation within the ultraviolet or in the visible.

39 Claims, 10 Drawing Sheets

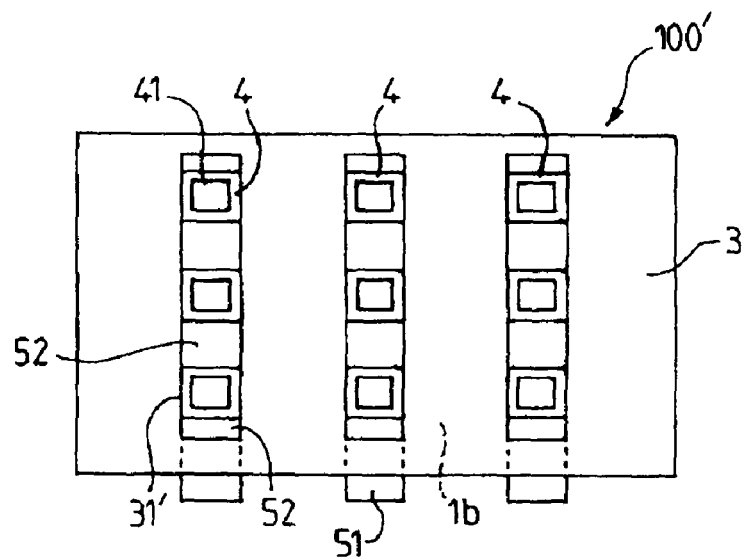
FIG. 3b
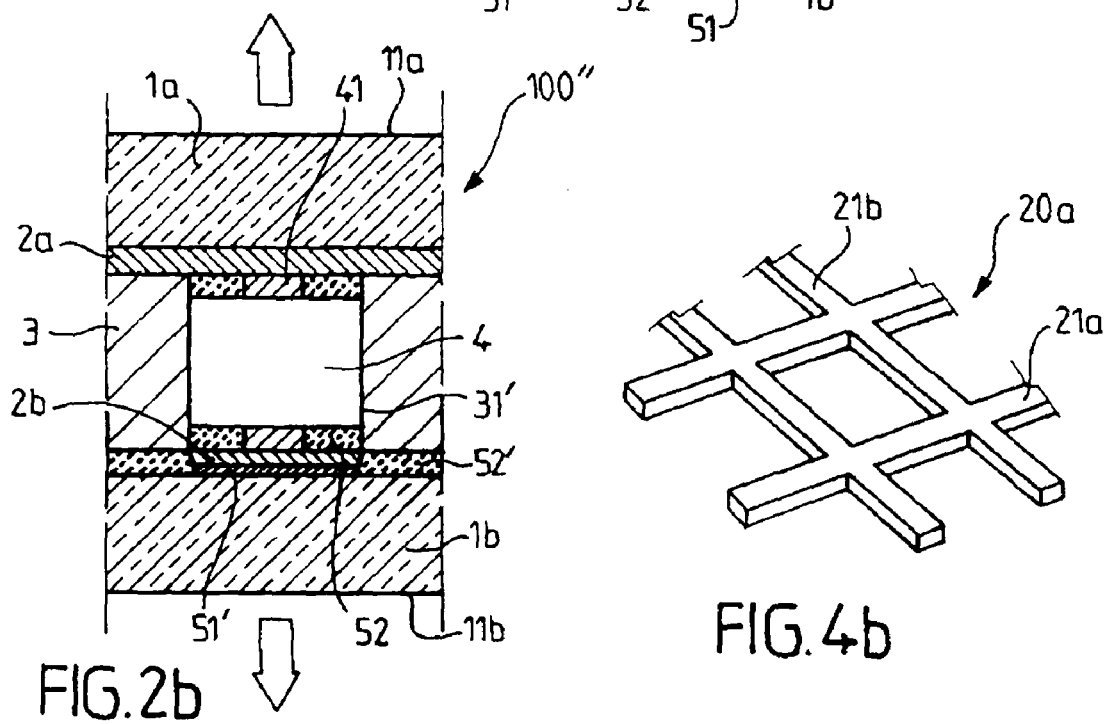
FIG. 2b
FIG. 4b
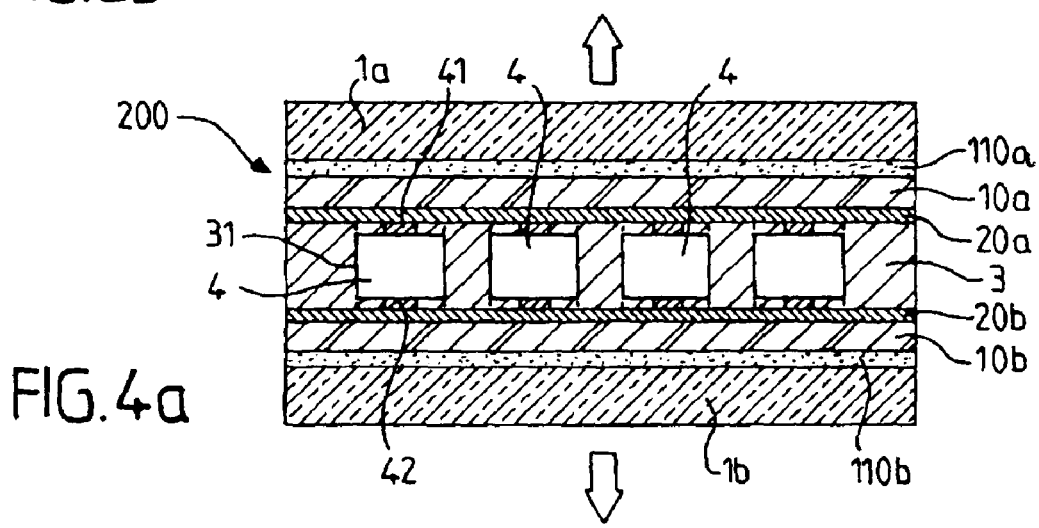
FIG. 4a

LIGHTING STRUCTURE COMPRISING AT LEAST ONE LIGHT-EMITTING DIODE, METHOD FOR MAKING SAME AND USES THEREOF

The present invention relates to a luminous structure and in particular to a luminous structure comprising at least one light-emitting diode, to the process for manufacturing this structure and to its applications.

A conventional light-emitting diode or LED generally comprises:
- a semiconductor chip;
- an envelope, often made of epoxy, which encapsulates the chip, the envelope having many functions (protection against oxidation and moisture, diffusing element, etc.); and
- electrical connection elements comprising two fine gold wires bonded to the contacts and connected to two metal pins emerging from the envelope.

It is known to insert such a light-emitting diode and its electrical connection circuit a laminated glass pane so as to give the latter automotive illumination or indicating functionalities.

Document WO 2004/062908 thus teaches laminated automotive glazing comprising at least two glass sheets, conventional diodes, with an individual envelope or a common one, being inserted between said sheets.

For the power supply, a conducting layer is deposited on the inner surface of one of the glass sheets. This conducting layer is divided into at least two separate conducting zones, separated by a fine insulating line formed by laser etching or by screen printing with a mask system, each of the two zones being connected to a separate tower. The LEDs are placed in parallel, one of their terminals being connected to the first conducting zone and the other terminal being connected to the second conducting zone.

The object of the present invention is to provide an alternative LED-based luminous structure that is more reliable and/or of simplified design, in particular in regard to the entire connection circuit (from the contacts to the power supply) so as to meet the industrial requirements (in terms of efficiency, and hence costs, rate, automation, etc.), thus making it possible to produce "low cost" products without sacrificing performance.

The purpose of the invention is also to enlarge the range of products available, with products having novel functionalities and/or dedicated to novel applications.

For this purpose, the present invention provides a luminous structure based on light-emitting diodes, which comprises:
- a first dielectric element with a substantially plane main face associated with a first electrode;
- a second dielectric element with a substantially plane main face associated with a second electrode that faces the first electrode and lies in a different plane;
- at least a first light-emitting diode, called first LED, comprising a semiconductor chip having, on the first and second opposed faces, first and second electrical contacts, the first electrical contact being electrically connected to the first electrode, the second electrical contact being electrically connected to the second electrode, and at least the first element at least partly transmitting radiation chosen the ultraviolet and the visible.

Thus, the present invention provides an alternative LED-based luminous structure. According to the invention, one or more LEDs having opposed contacts, and therefore spaced further apart, are chosen to be incorporated between two dielectric elements, thereby simplifying the connection system by associating them with respective electrodes on separate surfaces. This also makes it possible to dispense with the need to form fine etching lines to separate the polarities, such as the lines provided in the prior art.

The luminous structure may be very large, for example with an area of at least 1 $m^2$.

In one advantageous embodiment, the first electrical contact is electrically connected directly to the first electrode, and preferably the second electrical contact is electrically connected directly to the second electrode.

The electrical connections are called direct connections in the sense that the contacts and the electrodes are fastened together, no "intermediate" connection elements of the wire or pin type being employed, or even, preferably, with no direct contact/electrode soldering being employed; however, simple bonding with a conducting adhesive remains conceivable.

The direct connections prevent any dissipation or short-circuiting and any risk of a contact breaking. The connection also becomes invisible.

Moreover, the first electrical contact is in the form of at least one layer and preferably the second electrical contact is in the form of at least one layer.

In the present invention, the term "layer" may mean either a single layer or a multilayer. Thus, the contacts may be multilayers.

The contacts do not necessarily have the same size, especially the same width, nor made of the same material(s).

A connection may be made approximately at the centre of the contact or on its edge or it may be substantially distributed over the entire contact surface.

Preferably, the first LED has no envelope, especially an individual one, encapsulating the chip, thereby making direct connection(s) possible, and preferably the first LED consists of said chip, thereby simplifying the assembly and reducing the cost of the structure.

Of course, the LED preferably has neither a lens nor a diffusing element, or even no individual socket, for direct connections.

By reducing the height of the LED to preferably that of a simple chip, the structure according to the invention may also become more compact.

However, the first LED may include a partial protective envelope, leaving the first and second contact free, for example in order to protect the chip during handling operations or to improve the compatibility between the materials of the chip and other materials.

For the power supply, the luminous structure according to the invention may include current leads coupled to the first and second electrodes and especially in the form of screen-printed conducting strips made of a silver enamel that are preferably placed on the border of the first and/or second dielectric elements and especially on the border of the main faces. Pins, shims and cables may also be used.

The luminous structure according to the invention may include means for maintaining at least one of the direct connections between the first and second electrodes and the first and second electrical contacts, respectively, in order to increase the reliability and/or longevity, in particular:
- mechanically, by applying pressure to at least one of the main faces, said pressure being controlled for example by a pressure sensor that may be associated with, or even incorporated into, the structure; or
- by using a conducting adhesive.

The luminous structure according to the invention may furthermore include at least one elastic and/or flexible electrically conducting part placed between the first electrical contact and the first electrode in order to ensure that the first electrical connection is permanently maintained, and preferably the second electrical connection too.

This elastic and/or flexible electrically conducting part is preferably in the form of a spring, especially a helical spring, (frusto)conical spring or leaf spring, or in the form of a flexible tab folded into at least two (for example in the form of a U, a V, etc.).

The elastic and/or flexible electrically conducting part helps to alleviate possible fluctuations in flatness of the first electrode or even, as the case may be, the variations in thickness of the chip-supporting element, for example a lamination interlayer.

Preferably, each first direct connection (or each second direct electrical connection) is equipped with such a part.

The elastic and/or flexible electrically conducting part is preferably made of a single piece and may be bonded or soldered to the electrode and/or to the contact.

The electrically conducting part may be centred on the contact. This part may also preferably be of the same or larger width than the contact.

Typically, the electrically conducting part may be made of metal, especially copper or aluminium, and may be thin.

At least one of the first and second electrodes may also have one or more of the following additional functions:
    to reflect visible or UV light;
    to reflect thermal radiation, for providing solar protection, or to reflect infrared radiation for a low-emissivity or low-E function;
    or else to form an electrode of an optoelectronic element associated with the luminous structure (electrochromic element, switchable mirror, especially in the form of multilayer systems), for example to vary the colour, transparency, light transmission or reflection properties.

The structure may also integrate all functionalities known in the glazing field, either on the same face as that carrying an electrode, preferably the internal face of the associated dielectric element, or on an opposite face, or on faces of other elements that have been added. Among functionalities, mention may be made of the following: hydrophobic/oleophobic layer, hydrophilic/oleophilic layer, photocatalytic anti-soiling layer, multilayer reflecting thermal radiation (solar protection) or infrared (low-E) and antireflection.

Moreover, at least one of the first and second electrodes may cover substantially the associated main face, especially to facilitate and simplify the connections to the current leads, for example those located on the periphery.

At least one of the first and second electrodes may furthermore be chosen to be transparent or translucent, in particular for applications in the illumination field.

At least one of the first and/or second electrodes may be full, specially formed from contiguous conducting wires (parallel wires, in a braid, etc.) or from a metal sheet or tape (copper, etc.) to be bonded.

At least one of the first and second electrodes includes a conducting layer preferably distributed over or substantially covering the associated main face.

This conducting layer may be opaque, semi-transparent, for example made of screen-printed enamel, or transparent, made of a conducting metal oxide or having electron vacancies, especially fluorine-doped tin oxide ($SnO_2$:F), mixed indium tin oxide (ITO) and indium-doped or aluminium-doped zinc oxide.

This conducting layer may also be made of a conducting polymer or may be an adhesive.

This conducting layer may be deposited by any means known to those skilled in the art, such as liquid deposition, vacuum deposition (magnetron sputtering, evaporation), pyrolytic deposition (powder or vapour) deposition by screen printing or by inkjet printing.

In one advantageous embodiment, the luminous structure includes a thin conducting, especially metallic, low-emissivity and/or solar-protection layer, is covered with one or more thin dielectric layers and is optionally inserted between dielectric layers, said thin conducting layer at least partly forming one of the first and second electrodes.

Thus, this thin conducting layer, for example having a thickness of a few nanometers or about 10 nanometers, may be a (single) layer based on gold, palladium or, preferably, silver, and optionally incorporating other metals in minor amounts.

The multilayer may comprise a plurality of thin conducting layers optionally with different functionalities (solar protection in the case of one layer and low-emissivity for another layer located further inward).

The thin dielectric layer or layers above the last conducting layer, for example having a thickness of a few nanometers or about 10 nanometers, are for example based on the following materials:
    silicon nitride, carbonitride, oxynitride or oxycarbonitride;
    optionally doped metal oxides (for example zinc oxide and tin oxide).

This or these dielectric layers are capable of maintaining electrical conduction between the thin conducting layer and the contact on the chip, for example because they are sufficiently thin and/or sufficiently compressed in the electrical connection zone.

Preferably, the multilayer is transparent, not necessarily symmetrical and preferably does not include a mechanical protection layer in order to favour electrical conduction.

The two electrodes may comprise such a multilayer. This multilayer may be on glass or on a polymer, such as PET.

As examples of multilayers with a thin functional layer, mention may be made of the multilayers described in the documents EP718250, WO00/293477 and EP877006 incorporated here for reference.

As examples of multilayers with several thin functional layers, mention may be made of the multilayers described in the documents EP847965, WO03/010105, EP1060876 and WO01/20375 incorporated here for reference.

In one embodiment of the invention, at least one of the first and second electrodes comprises a conducting grid which preferably occupies substantially the associated main face.

This conducting grid may be in the form of a discontinuous conducting layer (whether opaque, semi-opaque or transparent), for example forming conducting strips. The layer zones may be isolated from one another by wide insulating zones. The layer-type conducting grid may be formed directly by deposition in predetermined zones or by removal from a full layer.

This conducting grid may be made up of linear conducting elements, and not surface elements (wide strips, etc.), for example each element forming at least one conducting line or being a conducting wire. The linear elements may also be of more complex shape, for example corrugated, zig-zagged, etc. The shape, arrangement and extent of the linear elements may be chosen according to the (predetermined) distribution of the LEDs.

The electrode may comprise a plurality of wires or lines in a first orientation or different orientations. A grid arrangement makes it possible to place the LEDs in a bespoke manner.

If necessary, the width of the wires (or lines) is limited:
so as to make the wires as discrete as possible to the naked eye if the electrode material is relatively opaque to the radiation; and/or
so as to avoid impairing the radiation emission.

For example, a width l1 of the wire (or line) of 50 µm or less, preferably 20 µm or even 10 µm.

More generally, this grid may be defined by a width l1 of the linear units (maximum width in the case of a plurality of widths) and a given pitch p1 between linear elements (minimum pitch in the case of a plurality of pitches).

Thus, it is possible to obtain an overall transparency (UV or visible) using a grid of conducting linear elements and by adapting, depending on the desired transparency, the width l1 and/or the pitch p1.

Also, the ratio of the width l1 to the pitch p1 may be equal to 50% or less, preferably 10% or less and even more preferably 1% or less.

For example, the pitch p1 may be between 5 µm and 2 cm, preferably between 50 µm and 1.5 cm and even more preferably between 100 µm and 1 cm, and the width l1 may be between 1 µm and 1 mm, preferably between 10 and 50 µm.

As an example, a grid of conducting lines, for example copper lines, with a pitch p1 of 100 µm and a width l1 of 10 µm, on a sheet of glass or plastic, for example PET, may be used.

A grid of conducting lines may be obtained by an inkjet.

It is also possible to use a grid of conducting wires while choosing a pitch p1 between 1 and 10 mm, especially 3 mm, and a width l1 between 10 and 50 µm, especially between 20 and 30 µm. This grid may be in the form of a series of wires (whether parallel or corrugated, whether or not in different orientations) which are partially incorporated into the surface of a lamination interlayer, especially a PVB or PU interlayer.

The electrodes may be hybrid electrodes, that is to say in the form of a layer and with wires.

The series of linear elements may be crossed. The grid may especially be organized as a mesh, woven or cloth. These linear elements may be made of metal, for example tungsten, copper or nickel.

The zone between the contact on the chip and the electrode may comprise one linear element or a plurality of linear elements connected to the same terminal.

When the two electrodes comprise grids of conducting linear elements, the latter are not necessarily identical or even in coincidence. In projection, these grids may form a mesh, especially one for addressing the LEDs.

The grid provides electrical continuity, in which case all the linear elements of the grid are associated with one and the same terminal.

Alternatively, all the linear elements of the grid are not associated with one and the same terminal and/or are not supplied simultaneously.

The structure may preferably include a second LED in the reverse position with respect to the first LED.

This makes it possible to carry out addressing LED by LED or by LED zone, for partial, discrete or dynamic illumination by or display of the LEDs.

For example, two series of conducting wires or lines are chosen to be substantially parallel to each other and connected to separate terminals via peripheral screen-printed strips made of a silver enamel.

More generally, the structure may comprise a plurality of LEDs and means for driving the LEDs in order to emit radiation either permanently or intermittently, and either of a given colour or of different colours, or in order to address the LEDs.

Each of the first and second electrodes may comprise a grid of conducting, preferably elongate or linear, elements along a given direction, these grids forming, in projection, a mesh.

It is also possible to provide an assembly by a series of LEDs.

In a first example, LEDs may be open (pre)assembled on one or more coplanar conducting supports, which are preferably thin, especially having a thickness not exceeding 1 mm, or even 0.1 mm, making up part of or forming one of the first and second electrodes.

In a second example, the structure comprises a plurality of first coplanar dielectric elements carrying first electrodes and with a plurality of first LEDs, the first dielectric elements being associated with a glass substrate preferably a mineral glass substrate, and preferably being thin, especially with the thickness not exceeding 1 mm, or even 0.1 mm, and possibly extending beyond the associated main face.

These first dielectric elements can be polyester sheets provided with full conducting layers or conducting grids as electrodes. These first dielectric elements may for example be in the form of strips.

Moreover, at least one of the first and second dielectric elements comprises a preferably flat glass element (the glass being mineral or organic glass) and this element being transparent or translucent or (semi)opaque and/or diffusing.

In one structural configuration with only one luminous "face" or for example that of the first dielectric element, the other dielectric element, the second one in this example, may be of any type, possibly opaque, for example a glass-ceramic or a non-glass dielectric. The partial translucency may serve to position the structure and/or for viewing or checking the operation of the structure.

Preferably, the transmission factor (possibly the overall transmission factor) of all the dielectric elements and electrodes associated with the emitting surface about the peak of the radiation in the visible (produced directly by the chip or by a phosphor) is equal to 50% or higher, more preferably 70% or higher and even 80% or higher.

The first and second dielectric elements may be of any shape (rectangular, square, round, oval, etc.), or even slightly curved, with the same radius of curvature, and are preferably parallel.

At least one of the first and second dielectric elements may serve for mechanical protection, being sufficiently rigid, and/or for chemical protection (against corrosion, moisture, etc.) and/or may provide electrical isolation.

In a first example, at least one of the first and second dielectric elements comprises a glass sheet, especially with a thickness of 4 mm or less.

The glass may be a clear, extra clear or coloured soda-lime-silica glass. Optionally, the glass may have undergone beforehand a heat treatment of the curing, annealing, toughening or bending type. This glass may also be frosted, sandblasted, screen-printed, etc.

The structure may be essentially mineral, especially for high flux resistance, for example if the first LED is a power LED.

At least one of the first and second dielectric elements may form part of an insulating glazing unit, under vacuum or argon, or with a simple air cavity.

In particular, an electrode may be associated with a first or second element, chosen to be made of glass, in various ways:
by being directly on its surface; or
being on a dielectric support element assembled with the glass element in such a way that the electrode is on the opposite face from the assembly face.

At least one of the first and second dielectric elements may be monolithic or laminated. This dielectric element may be formed from various combinations associating, for example, a mineral (rigid, monolithic or laminated) glass element and/or plastic (rigid, monolithic or laminated) sheets or other resins capable of being assembled with glass products by bonding.

As rigid plastic sheets, with a thickness of 0.1 to 10 mm, mention may be made of polyurethanes (PU), polycarbonates, acrylates, such as polymethyl methacrylate (PMMA), and polyesters, especially terephthalic polyesters (PET).

In a second example, at least one of the first and second elements comprises a polymeric film, especially made of polyethylene terephthalate (PET), especially with a thickness between 10 and 100 μm.

In a third example, at least one of the first and second dielectric elements comprises an adhesive, for example is a thermally curable or UV-curable adhesive or is made of a polymer that preferably forms a lamination interlayer with a mineral glass.

As usual lamination interlayer, mention may be made of polyurethane (PU), used in flexible form, an unplasticized thermoplastic, such as ethylene/vinyl acetate (EVA) copolymer, polyvinyl butyral (PVB), or a ethylene/acrylate copolymer, for example sold by DuPont under the name Butacite or sold by Solutia under the name Saflex. These plastic sheets have for example a thickness between 0.2 mm and 1.1 mm, especially between 0.38 and 0.76 mm. These plastic sheets may partially incorporate the electrodes into their thickness or the electrodes may be carried on their surface.

As other plastics, it is also possible to use polyolefins, such as polyethylene (PE), polypropylene (PP), PEN or PVC or ionomer resins.

Where appropriate, care is taken of course to ensure compatibility between the various plastics used, especially to ensure their good adhesion and/or temperature resistance.

Of course, any of the aforementioned dielectric elements is chosen so as improve said radiation (visible or UV) sufficiently if it is deposited on a side intended to transmit the light.

In one embodiment of the invention, the portion bounded by the first element and the second element forms, essentially, a laminated portion.

In another embodiment of the invention, the first and second elements are kept a substantially constant distance apart by peripheral sealing means (sealant, adhesive, etc.) or by spacers, and define an internal space incorporating said LED and filled with a dielectric.

This internal space may be under a low vacuum, in order to maintain direct connections, or this dielectric may be a resin, preferably transparent or aesthetically attractive.

The LED may be placed in a through-hole of a third, solid dielectric element inserted between the first and second dielectric elements.

The third dielectric is preferably thin, for example with a height not exceeding 95% of the height of the LED, transparent, substantially flat and made of glass, and may include a lamination interlayer.

The luminous structure comprises at least a second LED similar to the first LED and placed in the hole, it being possible for the height of the hole to be slightly greater than the height of the semiconductor chip, when there is an interlayer or any element whose surface melts at the time of assembly.

At least one of the first and second electrodes may be on the associated dielectric element or on this third dielectric element.

Preferably, the LEDs have a thickness not exceeding 5 mm, or even 1 mm, and even more preferably not exceeding 0.5 mm, the same applying to its width and its length.

The structure may include at least one phosphor coating associated with one of the first and second dielectric elements, said radiation exciting the phosphor.

This phosphor coating may be on the main face associated with an electrode or on the opposite main face of said dielectric element.

Advantageously, the phosphor material may be selected or adapted so as to determine the colour of the illumination within a broad palette of colours. The phosphor or mixture of phosphors may make it possible to obtain white light, especially from a monochromatic LED in the visible or near-UV.

All or part of the faces of at least one of the first and second dielectric elements may be coated with the phosphor material emitting in the visible, so as to constitute illuminating zones and juxtaposed "dark" zones. Moreover, the phosphor itself may be transparent.

The LED may also emit exciting UV radiation, for example UVC radiation (between 200 and 280 nm).

For example, the phosphor is coated on a main face opposite the face associated with an electrode, and the dielectric element is a material transmitting UV radiation, preferably chosen from quartz, silica, magnesium fluoride ($MgF_2$) or calcium fluoride ($CaF_2$), a borosilicate glass or a glass containing less than 0.05% $Fe_2O_3$.

As examples, for thicknesses of 3 mm:
magnesium and calcium fluorides transmit more than 80%, or even 90%, over the entire UV range; and
quartz and certain high-purity silicas transmit more than 80%, or even 90%, over the entire UV range.

The LED may also emit UV or near-UV exciting radiation, that is to say between 360 and 400 nm.

For example, the phosphor is coated on a main face opposite the face associated with an electrode and the dielectric element is a material transmitting this UV radiation, preferably chosen from borosilicate glass, such as "Borofloat" from Schott, which transmits more than 70% over the UVA range (for a thickness of 3 mm), soda-lime-silica glasses, with less than 0.05% $Fe^{III}$ or $Fe_2O_3$ (for a thickness of 3 mm), especially the glass "Diamant" from Saint-Gobain, the glass "Optiwhite" from Pilkington or the glass "B270" from Schott, which transmit more than 70%, or even 80%, over the entire UVA range (for a thickness of 3 mm).

Furthermore, a soda-lime-silica glass, such as the glass "Planilux" sold by Saint-Gobain, has a transmission greater than 80% above 360 nm, which may suffice for certain constructions and certain applications.

At least one of the first and second electrodes may be based on a material that transmits said UV radiation or may be arranged to allow said UV radiation to be transmitted overall if the material is UV-absorbent or UV-reflective.

The electrode material transmitting said UV radiation may be a very thin layer of gold, for example with a thickness of the order of 10 nm, or of alkali metals, such as potassium, rubidium, caesium, lithium or potassium, for example with a thickness of 0.1 to 1 μm, or else a layer of an alloy, for example a 25% sodium/75% potassium alloy.

A layer of fluorine-doped tin oxide may also be suitable.

Preferably, the chip may emit said radiation via the two opposed faces.

The structure may also have two "luminous faces" in order to let said radiation pass to the outside via the first and second main faces, or only a single "luminous face", the other side being absorbent or reflective.

The structure may include a diode that receives control signals, especially in the infrared, for remotely controlling the LED.

The structure according to the invention may be used for decorative, architectural, domestic or industrial illumination, especially to form a flat luminaire, such as an illuminating wall, especially one that is suspended, or an illuminating tile or a lamp, especially one with a very small thickness. The structure may also have a night time illumination function or an information display function, of any kind of design, logo, alpha-numeric or other signalling type, for example in order to form a panel of the teaching type, etc.

LEDs may be arranged on the border or they may be distributed, either regularly or not, over the entire surface of the structure according to the invention, and possibly constitute decorative features or constitute a display, such as a logo or a trade mark.

The luminous structure, especially glazing, may be:
intended for buildings;
intended for urban furniture, such as a bus shelter, indicating or advertising panel, or intended for an aquarium, a display cabinet, a shop window, a shelf element or a greenhouse;
intended for interior furnishings, or for a mirror;
intended for a screen of a display system of the computer, television or telephone type;
or else be electrically controllable, such as liquid-crystal glazing, and especially a back lighting device for a liquid-crystal display; or
photovoltaic glazing, optionally with an electrical storage system (a battery), especially to provide the power supply.

The structure according to the invention may be integrated for example into domestic electrical equipment, for example in a refrigerator shelf or a kitchen shelf.

The structure may serve as a door, as an office or shop partition, balustrade, building facade (windowed) or structural glazing fixed at discrete points (of the "Spider" product type, sold by Saint-Gobain, etc.), or else as glass for furniture, glass for jewellers' display cases, museum glass, etc.

The structure may preferably be transparent, at least outside the LED zone(s), for example to form an illuminating window.

Furthermore, the LED(s) may be almost invisible to the naked eye in the "off" state.

The luminous structure may form illuminating glazing for a transport vehicle, for example a windscreen, rear window, side window, sunroof, whether of the opening or non-opening type, rear-view mirrors, or protective glass or any terrestrial, waterborne or airborne vehicle.

The insertion of LEDs into such glazing makes it possible in particular for the following indicating functions to be provided:
display of luminous indicators intended for the driver of the vehicle or the passengers (for example, an engine temperature alarm indicator in the windscreen, an indicator showing that the electrical system for de-icing the windows is in operation);
display of luminous indicators intended for persons outside the vehicle (for example, a display in the side windows indicating that the vehicle's alarm is in operation);
luminous display on vehicle glazing (for example a flashing luminous display on emergency vehicles, a safety display operating with a low energy consumption, indicating the presence of a vehicle in a hazardous situation).

Inserting LEDs into automotive glazing makes it possible in particular to provide the following lighting functions:

ambient lighting of the interior of a vehicle in a particularly attractive manner (for example by integrating ambient lighting in the glass roof of a vehicle);
brake lights and head lamps in the surface of the glazing (for example integration into the rear window of the vehicle's third brake light).

The LED may be a "high-power" LED, that is to say generating more than 80 lumens per 1000 mA.

To avoid dazzlement, an element such as a diffuser may be added to the structure, especially in the form of an additional diffusing layer. At least one of the first and second dielectric elements may also fulfil this diffusing function.

The LED may be of lower power, without any risk of hazard to one's eyes, i.e. a power of less than 20 lumens per 100 mA.

It is also possible to produce illumination delivering 10 to 500 lumens, preferably 20 to 250 lumens and economically 30 to 100 lumens.

The invention also relates to a plastic sheet, especially a thermoplastic of the PVB, EVA or PU type, or an polyethylene/acrylate copolymer or a polyolefin, having at least one hole passing through its thickness, said hole containing at least a first light-emitting diode, with a semiconductor chip having, on first and second opposed faces, first and second electrical contacts respectively.

Of course, this sheet may preferably be transparent and/or may serve as a lamination interlayer.

Finally, the invention relates to a process for manufacturing the luminous structure as defined above, comprising the following steps:
positioning the first electrical contact of the first LED directly on the first electrode or via a conducting adhesive and/or via an elastic and/or flexible electrically conducting part; and
positioning the second electrode directly on the second electrical contact or via a conducting adhesive.

This process, which is simple to implement, allows direct electrical connection of the first and second electrical contacts to the first and second electrodes respectively.

This process may include a subsequent step of creating a low vacuum in the structure containing said internal space, so as to reinforce the electrical connections, for example a pressure of around 200 mbar.

This process may include a subsequent step of injecting a liquid dielectric resin between the first and second electrodes and on either side of the chip, so as to protect and/or better fix and/or isolate the chip.

Preferably, this injection is carried out under a low vacuum.

Said third dielectric element is to be a lamination interlayer and said insertion step is carried out hot, preferably during a hot formation step for producing said hole.

Other details and advantageous features of the invention will become apparent on reading the examples of luminous structures based on LEDs illustrated by the following figures:

FIGS. 2b, 2c show schematically partial sectional views of luminous structures based on LEDs in alternative forms of the first embodiment of the invention;

FIGS. 3a, 3b show schematically top views of the luminous structure based on LEDs of the first embodiment of the invention and of one of its alternative forms;

FIG. 4a shows schematically a sectional view of a luminous structure based on LEDs in a second embodiment of the invention and FIG. 4b is a detail of one of the conducting grids used as electrode in this second embodiment;

FIG. 5b is a detail of FIG. 5a;

FIG. 6b is a detail of FIG. 6a;

It should be pointed out that, for the sake of clarity, the various elements of the objects shown have not necessarily been drawn to scale.

Figure 1:
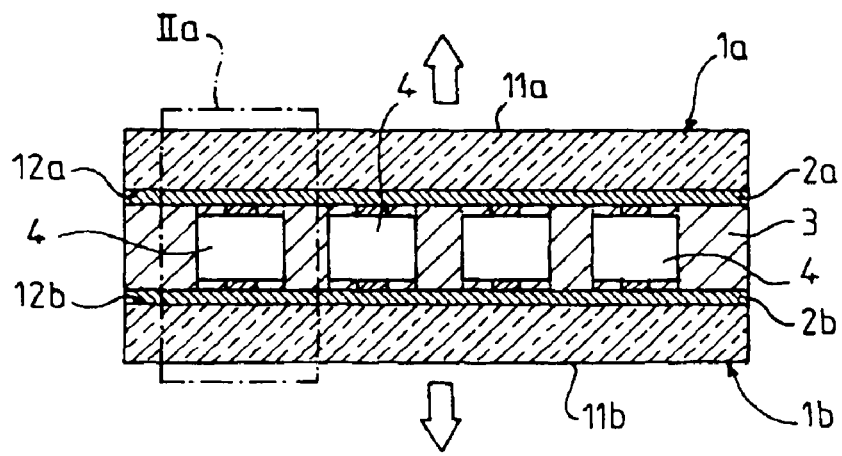
FIG. 1 shows schematically a sectional view of a luminous structure based on LEDs in a first embodiment of the invention.
Figure 2A:
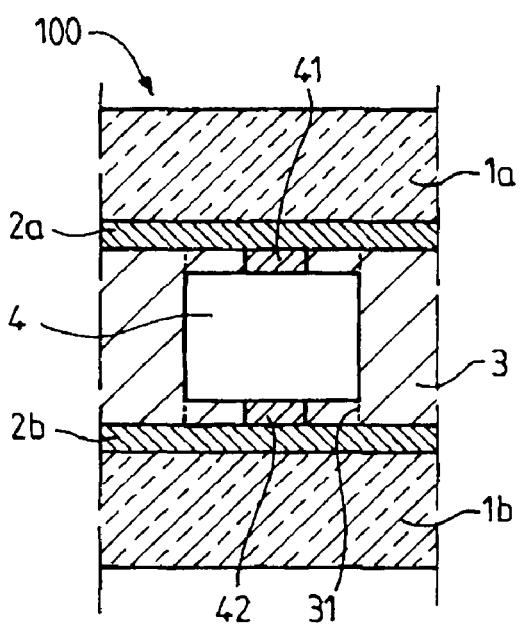
FIG. 2a is a detail of FIG. 1.
Figure 3A:
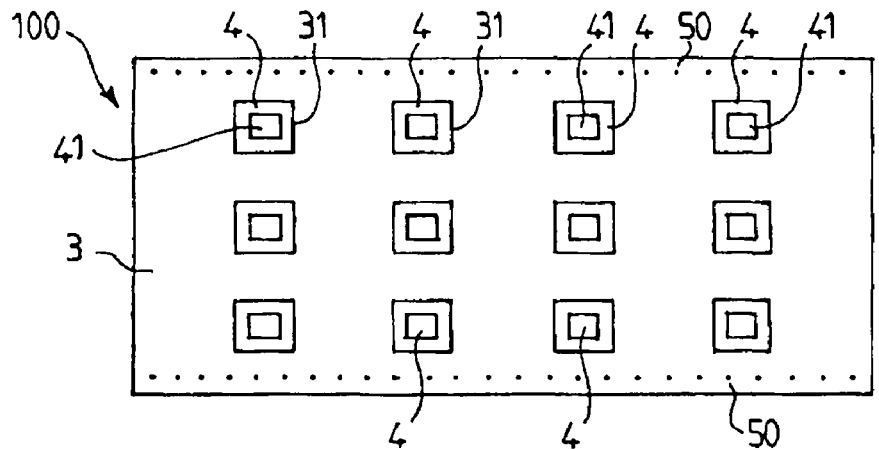

FIG. 1 shows schematically a sectional view of a luminous structure 100 based on LEDs in a first embodiment of the invention and FIG. 2a is an enlarged view of a portion of FIG. 1, while FIG. 3a is a bottom view of the structure 100.

This structure emits via the external faces 11a, 11b (the emission is shown symbolically by the two arrows) of the first and second glass sheets 1a, 1b, preferably made of extra-clear soda-lime glass, for example with a thickness of 4 mm.

The first and second glass sheets include, on their internal faces 12a, 12b, transparent conducting layers 2a, 2b based on fluorine-doped tin oxide, said conducting layers being connected to separate terminals.

Placed between these layers 2a, 2b are a sufficient number of LEDs 4 to obtain the desired luminous effect. The LEDs are isolated from one another by a preferably thin transparent dielectric 3, for example with a height not exceeding 95% of the height of the LEDs. Preferably, the dielectric 3 is a lamination interlayer such as a PVB interlayer.

More precisely, as shown in FIG. 2, each of the LEDs 4 are placed inside an individual through-hole 31 in the interlayer 3.

Preferably, each LED simply comprises a semiconductor chip 4, for example with an active multi-quantum-well layer based on AlInGaP technology or other semiconductors.

The LED is for example a monochromatic LED. All colours are conceivable. The power may also be adjusted via the supply.

This chip includes first and second contact layers 41, 42 on its opposed faces, for example in the form of an Au/Zn and Al multilayer for one face and an Au/Ge alloy for the other face.

Suitable chips are for example those sold under the names LED AlInGaP HWFR-B310, 410 and 510 by Lumileds.

To reduce the costs to limit and simplify the connections, the chip 4 is preferably chosen to be unencapsulated and the first and second contact layers 41, 42 are placed directly on the first and second conducting layers 2a, 2b, respectively.

Figure 2C:
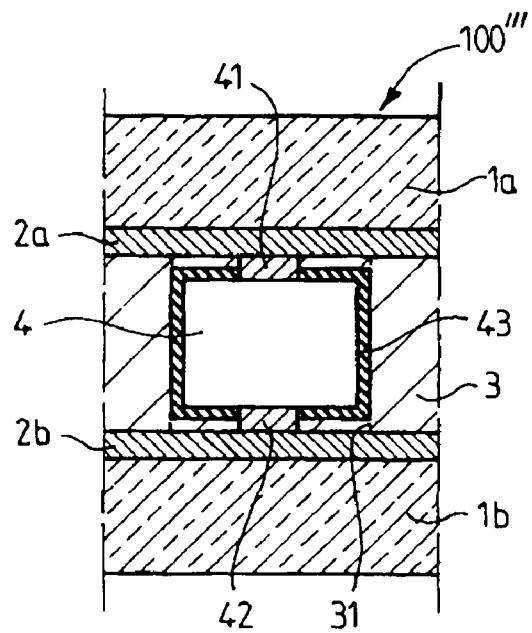

However, as shown in FIG. 2c, the LED can alternatively be partially encapsulated by an envelope 43 provided around a portion of the LED.

The connection circuit is completely invisible, even when using two extra-clear glass sheets.

Figure 18:
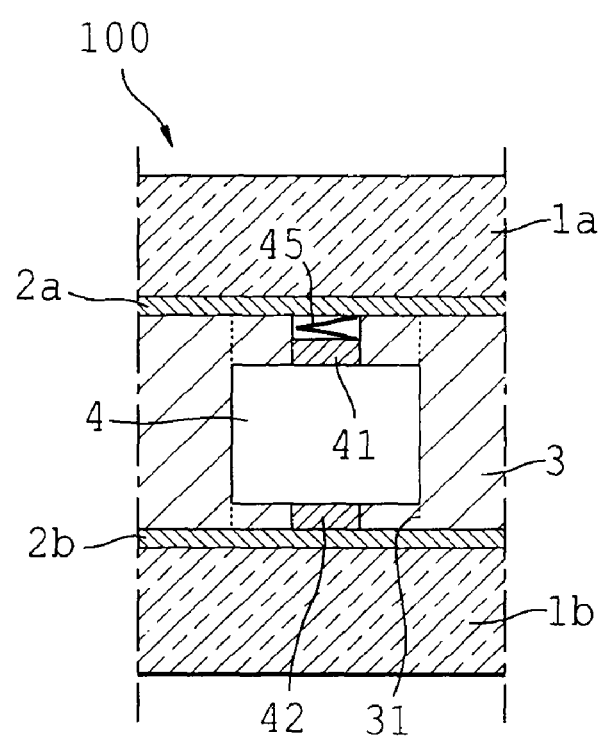
FIG. 18 shows schematically a partial sectional view of a luminous structure based on LEDs according to another embodiment of the invention.

In an alternative form, a simple conducting adhesive, for example a silver adhesive, is interposed between the first and second contacts 41, 42 and the first and second layers 2a 2b. The adhesive must be chosen for its resistance to high temperatures and pressure necessary for producing the laminated glazing. In another alternative form, an elastic 45 is placed between the first electrical contact 41 and the first layer 2a in order to ensure that the first electrical connection is permanently maintained, as shown in FIG. 18.

The risks of the adhesive flowing are less critical than in the prior art, in which scrupulous measures have to be taken to ensure that the adhesive does not spread into the isolating strip when the laminate is being laminated.

Because the LEDs have been reduced in size to the maximum possible, when the device is turned off they are practically invisible. It is therefore particularly conceivable to place LEDs not only on the perimeter of the glazing but also over the central portion or over a large portion of the glazed area without thereby impeding visibility, as shown in FIG. 3a in which, for the sake of clarity, the first dielectric element 1a and the layer 2a have been omitted so that the lamination interlayer 3 with the LEDs 4 can be seen in top view.

Current leads, for example in the form of screen-printed conducting strips 50 (some of these have been shown as dots in FIG. 3a) are placed along the longitudinal edges of the internal main faces of the glass sheets so as to be coupled to the electrodes.

In this first embodiment, the LEDs are placed in series. The voltage applied between the electrodes is of the order of one volt or around 10 volts, preferably 24 volts or less.

The LEDs may form a luminous pattern, for example a logo or a trade mark.

By inserting a large number of LEDs, a luminous intensity equivalent to that of incandescent lighting may be obtained only requiring a lower consumption.

This structure may for example serve for decorative illumination or for signalling, for example as a luminous panel or partition.

As a variant, the glass sheet intended to be on the outside may be a coloured glass sheet. This type of laminated glass is particularly appropriate for producing a motor vehicle roof.

Its light transmission ($T_L$) may be lowered to 14% and its energy transmission ($T_E$) to 11%.

One of the LEDs may be replaced with an LED serving for remotely controlling the structure, receiving signals in the infrared.

One or both of the transparent conducting layers may be in a multilayer stack, and be silver layers.

The structure according to the invention is not necessarily symmetrical. It is possible to use separate dielectric elements, electrodes made of a different material, or using a different technology.

In a first example, one of the transparent layers may be replaced with a screen-printed semi-transparent layer, with a mirror layer, for example a silver layer, or with a coloured opaque layer (made of enamel, etc.), for example to make the LEDs invisible from one side of the structure.

In a second example, one of the transparent layers may be replaced with a grid of conducting filaments, especially wires or lines.

In a third example, zones of layers may be etched.

At least one of the main faces of the glass sheets may include a solar-protection layer, a low-E layer, a self-cleaning layer, etc.

Various types of LED may be provided. At least one of the LEDs may emit radiation that excites a phosphor added to one of the main faces, for example UVA or UVC radiation.

One example of the manufacture of the structure comprises the following steps:
  provision of glass sheets coated with transparent conducting layers (or deposition of layers on bare glass sheets);
  optional precoating with adhesive, by placing spots of adhesive on the predefined zones on one of the two glass sheets;
  formation of individual holes by localized heating and the hot insertion of the LEDs into these holes; and
  autoclaving of the structure in a cycle well known to those skilled in the art.

In the first alternative form, shown in FIG. 2b, the structure 100" differs from the structure 100 in the following way:
  the LEDs are aligned in series and preassembled on preferably thin coplanar dielectric supports 51' (for example PET sheets) and each support is coated with a conducting layer 2b (or any other type of electrode); and
  each series of LEDs is inserted into a common through-hole 31', for example a rectangular slot, it being possible for this slot to emerge on at least one of the edges and being filled with a transparent or aesthetically attractive resin 52 after positioning the LEDs, just like the space between the supports 51'.

The width of the supports 51' may be identical to or greater than that of the LEDs. The conducting supports 51' are assembled for example via thin layers of adhesive (not shown) to the glass sheets 1a, 1b.

The slots may have a sufficient height to incorporate the supports, and in this case the slots preferably emerge at the edge or edges where the electrodes are connected.

The face 11b may or may not transmit light.

Hybrid arrangements, with individual holes and common holes, may be provided.

FIG. 3b shows a second alternative form of the structure 100 in which, for the sake of clarity, the first dielectric element 1a and the layer 2a have been omitted in order to reveal the lamination interlayer 3 with the LEDs 4 in top view.

The structure 100' differs in the following way:
  the LEDs are aligned in series and preassembled on coplanar conducting supports 51 of the conducting thin sheet type, replacing (or in addition to) the first conducting layer 2b, and preferably extending beyond at least a longitudinal edge of the main face in order to facilitate the power supply, or even both edges for uniform distribution; and
  each series of LEDs is inserted into a common through-hole 31' in the interlayer 3, for example a slot, for example a rectangular slot, possibly with rounded edges, which slot is filled with a transparent or aesthetically attractive resin 52 after the LEDs have been positioned.

The conducting supports 51 are for example connected to one and the same terminal. The conducting supports 51 are assembled for example via thin layers of adhesive (not shown) to the glass sheets 1a, 1b.

The width of the conducting supports 51 may be identical to or greater than that of the LEDs.

The slots may be of sufficient height to incorporate the conducting supports, and in this case the slots preferably emerge on the edge or edges where the conducting supports are supplied.

Hybrid arrangements, with individual holes and common holes, may be provided.

The face 11b may or may not transmit light.

One LED or a series of LEDs may be in inverted positions (the chips then being upside down) and be supplied with reversed polarities. This makes it possible in particular for lit zones and unlit zones to be able to be alternated by suitable drive means.

In a third alternative form, shown in FIG. 2c, the structure 100''' differs in that the chip includes a partial envelope leaving the contacts 41, 42 free, and serving, for example, to protect the chips during assembly.

FIG. 4a shows schematically a sectional view of a luminous structure 200 based on LEDs in a second embodiment of the invention.

The structure 200 differs from the structure 100 in the following way:
  the transparent conducting layers are replaced with grids of conducting elements 20a, 20b that are everywhere transparent; and
  these grids are supported by preferably thin PET sheets and assembled, for example, by thin layers of adhesive 110a, 110b or, as a variant, by lamination interlayers.

These grids 20a, 20b are in the form of copper conducting lines, for example forming a continuous electrical arrangement, and are for example organized as a mesh as shown in FIG. 4b. In this configuration, each grid 20a, 20b is connected to a single terminal, for example via four screen-printed strips (two lateral strips 21b and two longitudinal strips 21a) on the periphery of each main face 12a, 12b.

A sufficient number of LEDs 4 is placed between these grids 20a, 20b in order to obtain the desired luminous effect.

In an alternative form, each of the grids is formed from a single series of lines, which may or may not be parallel, depending on the distribution of the LEDs on the main faces. The lines of a grid are for example connected to a single terminal, for example via two screen-printed strips on the periphery of two opposed edges of its internal main face 12a, 12b.

The conducting lines are for example sufficiently thin and/or spaced apart for overall transparency.

Lines of a grid may also be connected to separate terminals in order to perform addressing operations etc.

Alternative forms similar to those described in the case of the first embodiment may be provided (dissymmetry of the structure, common hole, coplanar supports, partial encapsulation, opaque layer, mirror, additional functions of the solar-protection type, etc.). Hybrid arrangements, with individual holes and common holes, with various categories of LED, may especially be provided.

Figure 5A:
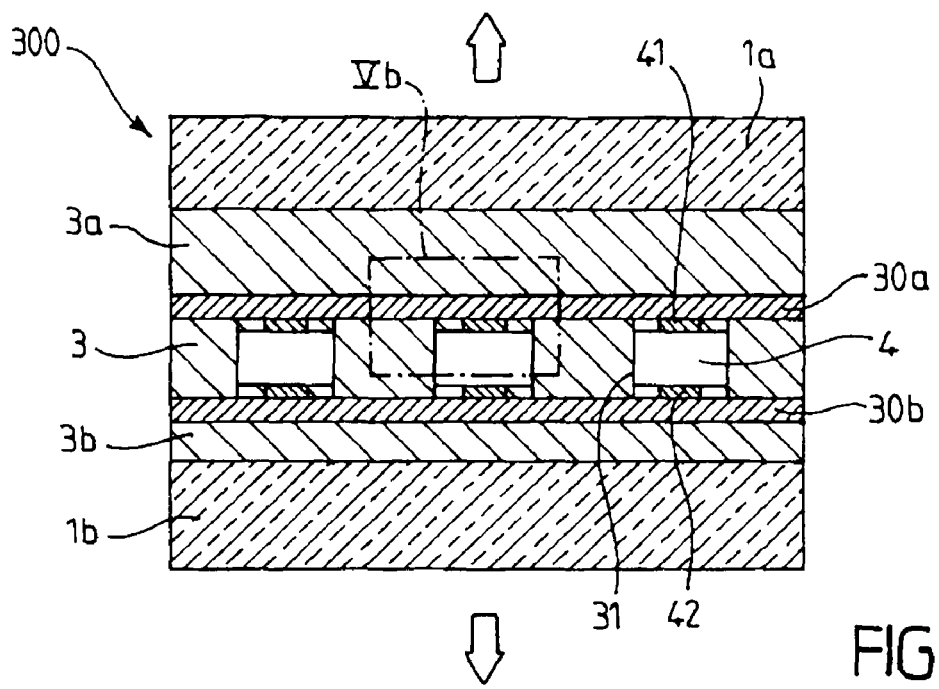
FIG. 5a shows schematically a sectional view of a luminous structure based on LEDs in a third embodiment of the invention.
Figure 5B:
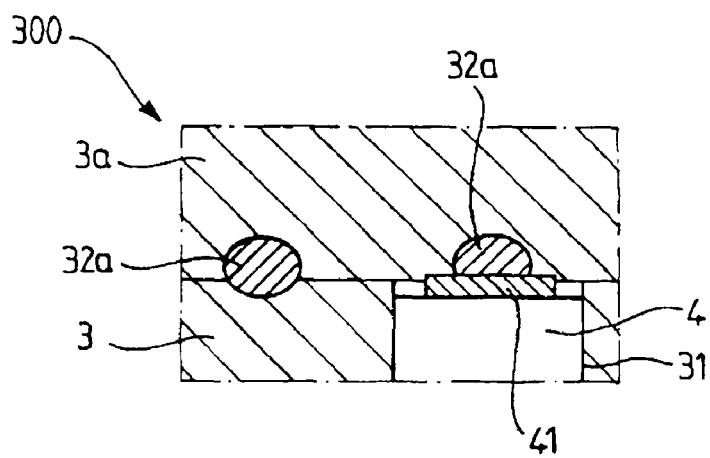

FIG. 5a shows schematically a sectional view of a luminous structure 300 based on LEDs in a third embodiment of the invention.

The structure 300 differs from the structure 100 in the following way:
the transparent conducting layers are replaced with grids 30a, 30b of conducting wires 32a, these wires being partially inserted into additional lamination interlayers 3a, 3b or into any other suitable dielectric material.

The wires of each grid 30a, 30b are for example connected to a single terminal, for example via two screen-printed strips on the periphery of two opposed edges of the associated internal main face.

The grids are preassembled on the elements 3a, 3b or interposed during assembly of the structure.

A sufficient number of LEDs 4 is placed between these grids 30a, 30b in order to obtain the desired luminous effect.

Alternative forms similar to those described in the case of the first embodiment may be provided (dissymmetry of the structure, common hole, coplanar supports, partial encapsulation, opaque layer, mirror, additional functions of the solar-protection type, etc.). Hybrid arrangements, with individual holes and common holes, with various categories of LED, may especially be provided.

Figure 5C:
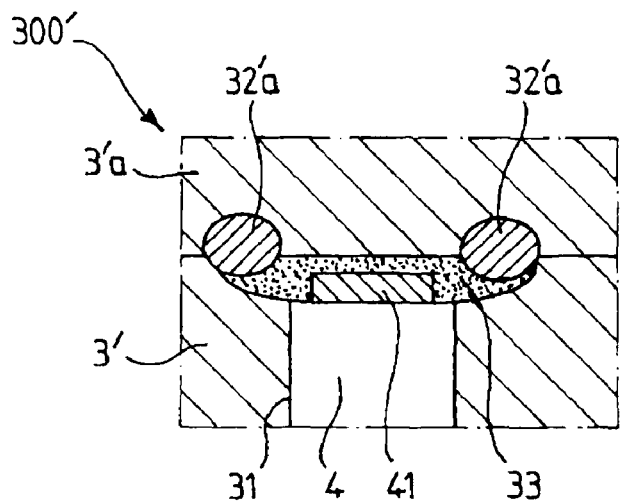
FIG. 5c shows schematically a partial sectional view of a luminous structure based on LEDs in an alternative form of the third embodiment of the invention.

In an alternative form, shown in FIG. 5c, the structure 300' differs from the structure 300 in the following way.

Each grid of conducting wires 32a' is preassembled in the PVB sheet 3' or interposed during assembly between the PVB sheet 3' and the second lamination interlayer 3'a so as to be in direct connection with the associated contact 41 via a layer of conducting adhesive 33.

Figure 6A:
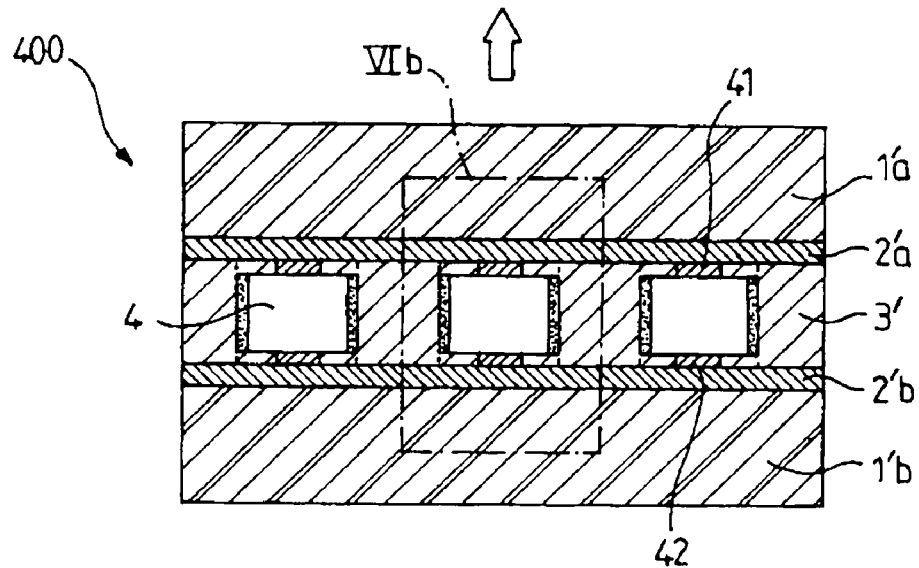
FIG. 6a shows schematically a sectional view of a luminous structure based on LEDs in a fourth embodiment of the invention.

FIG. 6a shows schematically a sectional view of a luminous structure 400 based on LEDs in a fourth embodiment of the invention.

The structure 400 differs from the structure 100 in the following way:
the glass sheets are replaced with PMMA sheets 1'a, 1'b;
the transparent conducting layers are replaced with a conducting polymer layer 2'a and a mirror layer 2'b, respectively, the sheet 1'b then possibly being opaque or semi-opaque; and
the lamination interlayer 3 is replaced with a non-adhesive, preferably thin and transparent, solid dielectric 3', for example a thin glass sheet or a PET sheet.

Figure 6B:
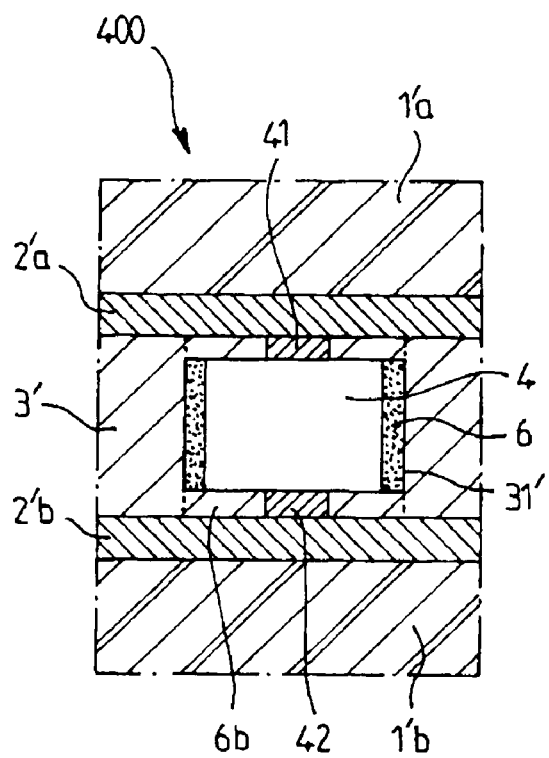

As shown in FIG. 6b, each LED is inserted into a hole 31' in the PET sheet 3' and fixed laterally by a dielectric adhesive 6.

The contacts 41, 42 may also be connected to the layers 2'a, 2'b by spots of conducting adhesive 6a, 6b.

A sufficient number of LEDs 4 is placed between these conducting surfaces 2'a, 2'b in order to obtain the desired luminous effect.

The structure 400 emits radiation in the visible only via the face 11a (shown symbolically by the single arrow), for example for use as an illuminating tile, ceiling, or as wall lighting, or else for being integrated into domestic electrical equipment.

Figure 6C:
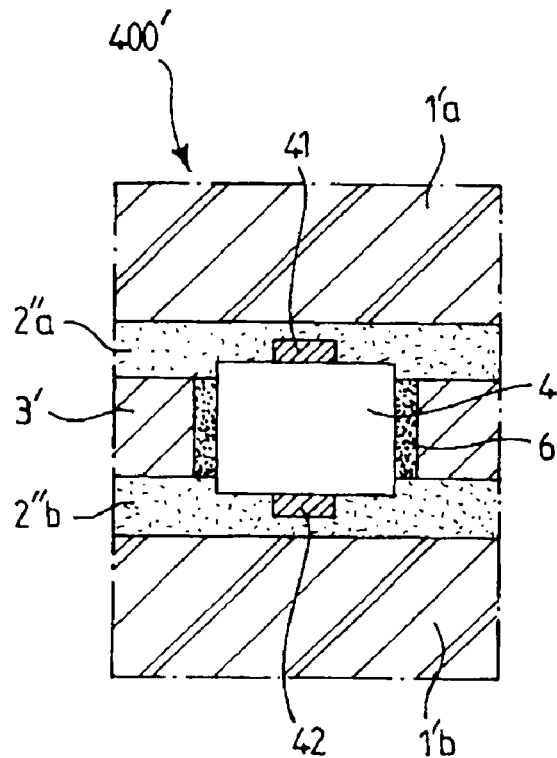
FIG. 6c shows schematically a partial sectional view of a luminous structure based on LEDs in an alternative form of the fourth embodiment of the invention.

In an alternative form, shown in FIG. 6c, the conducting layers are replaced with layers of adhesive 2"a, 2"b which are sufficiently conducting and thin enough to be transparent, the contacts then being embedded in these layers of adhesive 2"a, 2"b.

Moreover, the thickness of the solid dielectric 3' is for example less than that of the LED.

Alternative forms similar to those described in the case of the first embodiment may be provided (dissymmetry of the structure, common hole, coplanar supports, partial encapsulation, opaque layer, mirror, additional functions of the solar-protection type, etc.). Hybrid arrangements, with individual holes and common holes, with various categories of LED, may especially be provided.

Figure 7:
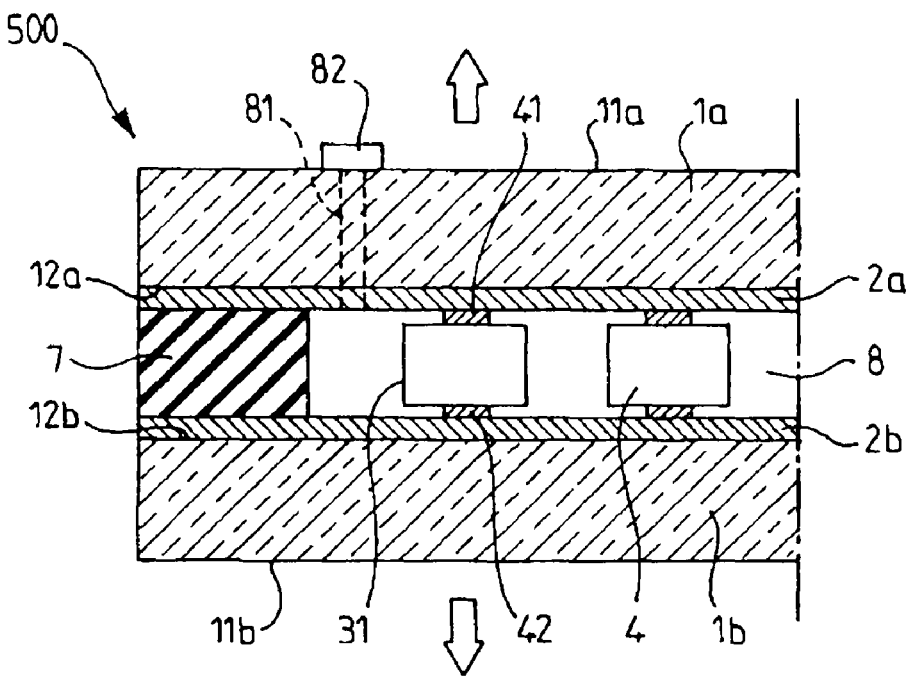
FIG. 7 shows schematically a sectional view of a luminous structure based on LEDs in a fifth embodiment of the invention.

FIG. 7 shows schematically a sectional view of a luminous structure 500 based on LEDs in a fifth embodiment of the invention.

This luminous structure 500 comprises first and second glass sheets 1a, 1b, each having an external face 11a, 11b and an internal face 12a, 12b.

The structure 500 emits radiation in the visible via both external faces. First and second electrodes 2a, 2b are placed on the internal faces 12a, 12b as a conducting and preferably transparent coating, for example made of fluorine-doped tin oxide.

Sheets 1a, 1b are associated with their internal faces 12a, 12b facing each other and are assembled by means of a sealing frit 7, for example a glass frit with a thermal expansion coefficient close to that of the glass sheets 1a, 1b, such as a lead-glass frit.

In an alternative form, the sheets are assembled by an adhesive, for example a silicone adhesive, or else by a heat-sealed glass frame. These methods of sealing are preferable if sheets 1a, 1b with difference expansion coefficients are chosen. This is because the sheet 1b may be made of a glass material, or more generally a dielectric material suitable for this type of structure, whether translucent or opaque (if illumination from this side is precluded).

The area of each glass sheet 1a, 1b is for example of the order of 1 m² or greater, and their thickness is 3 mm. Preferably, an extra-clear soda-lime-silica glass is chosen. These sheets are for example rectangular.

The spacing between the glass sheets is fixed by the LEDs placed between the sheets in an internal space 8. A low vacuum, for example of around 200 mbar, is created in the internal space between the LEDs, making it possible to maintain firm direct connections.

The first glass sheet 1a has, near its periphery, a hole 81 drilled through its thickness, with a diameter of a few millimeters, the orifice of which is obstructed by a sealing disc 82, especially made of copper soldered onto the external face 31.

This structure is essentially mineral so that it is particularly suitable for power LEDs.

As a variant, the structure 500 emits radiation in the visible only via the face 11a, for example for use as an illuminating tile, ceiling, or wall lighting, or as back lighting for a liquid-crystal matrix.

Alternative forms similar to those described in the case of the previous embodiments may be provided (dissymmetry of the structure, grids of conducting wires, coplanar supports preferably of mineral nature, opaque layer, mirror, addition of one or more coatings of phosphor material(s), use of LEDs emitting in the UV, additional functions of the solar-protection type, etc.). Hybrid arrangements, with individual holes and common holes, with various categories of LED, may especially be provided.

The current leads may also be of the busbar type placed on the periphery of the faces 12a, 12b, as already described above.

Figure 8:
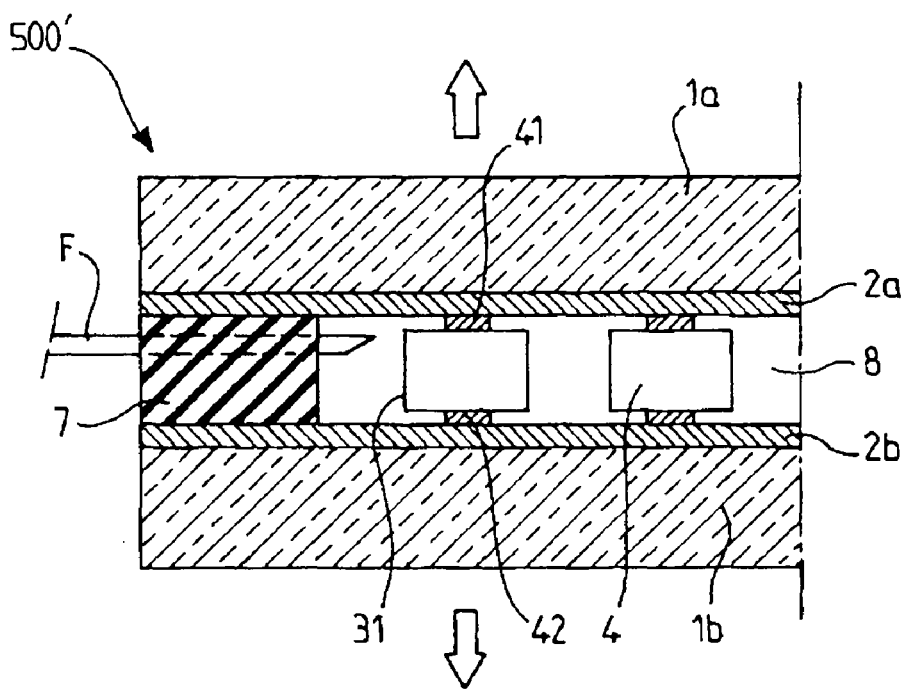
FIG. 8 shows schematically a sectional view of a luminous structure based on LEDs in an alternative form of the fifth embodiment of the invention.

FIG. 8 shows an alternative form of the structure 500. This structure 500' differs by the absence of the vacuum hole 81 and the disc 82. The vacuum is in fact created by a system of hollow needles F, for example made of metal.

Figure 9:
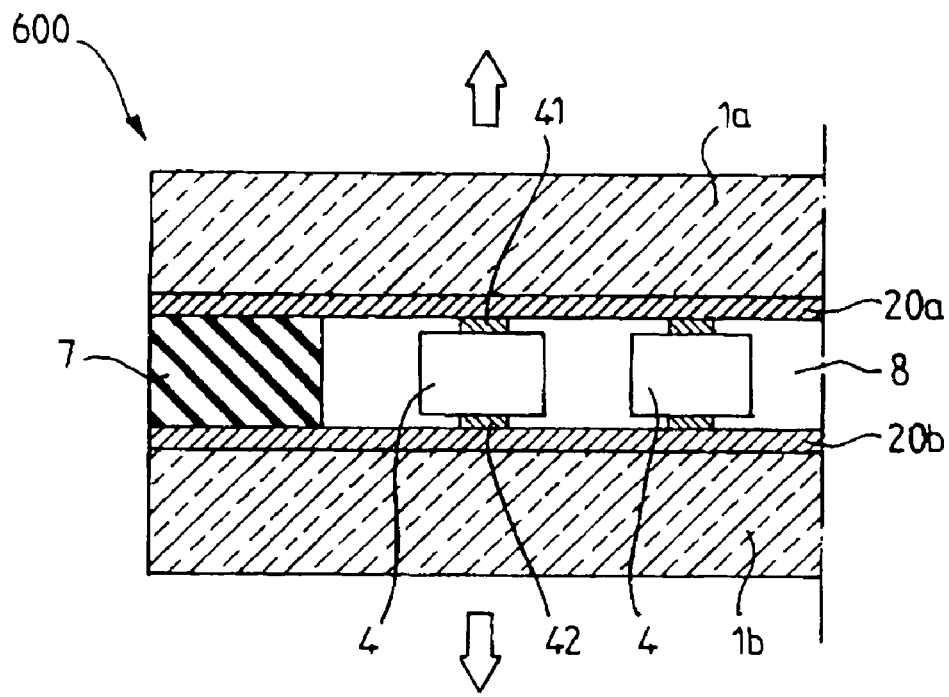
FIG. 9 shows schematically a partial sectional view of a luminous structure based on LEDs in a sixth embodiment of the invention.

FIG. 9 shows schematically a partial sectional view of a luminous structure 600 based on LEDs in a sixth embodiment of the invention. This structure 600 differs from the structure 500 in that the transparent conducting layers are replaced with grids of conducting lines 20a, 20b similar to those described in relation to FIG. 4a.

Figure 10:
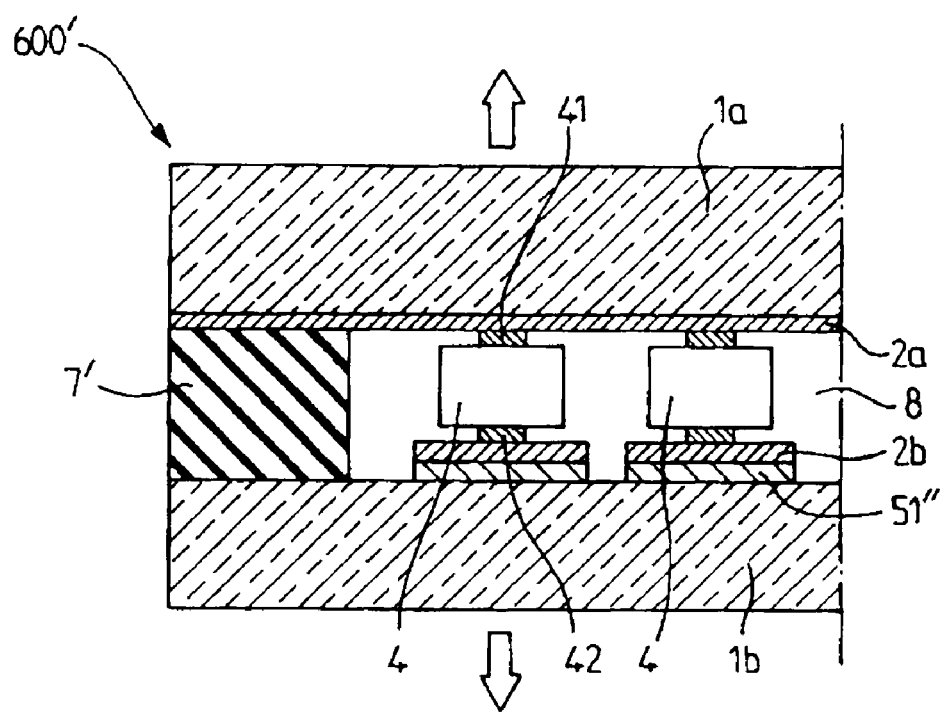
FIG. 10 shows schematically a partial sectional view of a luminous structure based on LEDs in an alternative form of the sixth embodiment of the invention.

FIG. 10 shows schematically a partial sectional view of a luminous structure 600' based on LEDs in an alternative form of the fifth embodiment of the invention.

This structure 600' differs from the structure 500 in that the transparent conducting layer 2b covering the entire internal face 12b is replaced with coplanar dielectric supports 51" (preferably mineral-based for high power levels, for example thin glass sheets with a thickness of 0.1 to 0.3 mm) that are coated with transparent conducting layers 2b. As a variant, conducting supports are chosen.

Figure 11:
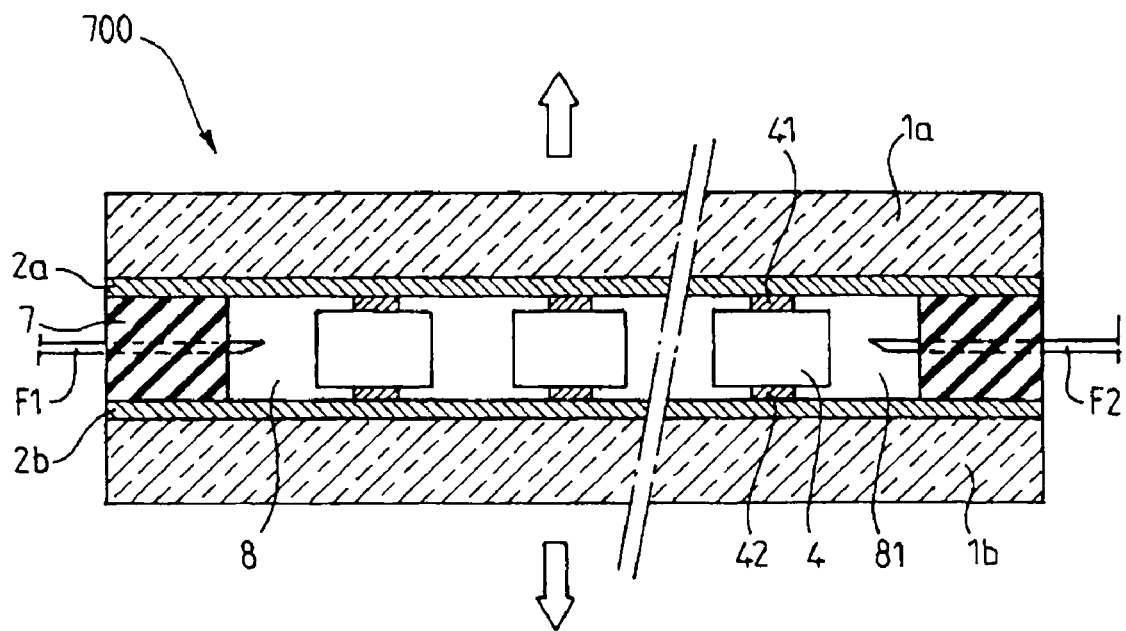
FIG. 11 shows schematically a partial sectional view of a luminous structure based on LEDs in a seventh embodiment of the invention.

FIG. 11 shows schematically a partial sectional view of a luminous structure 700 based on LEDs in a seventh embodiment of the invention.

This structure 700 differs from the structure 500' in that a transparent dielectric resin 81 is injected, preferably under a low vacuum, into the internal space 8 using a system of hollow needles F1, F2.

Figure 12:
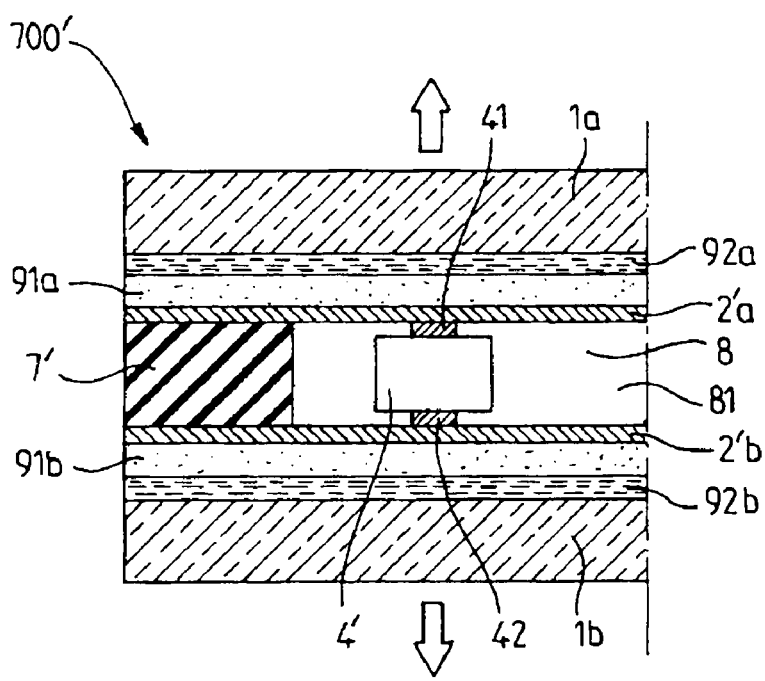
FIG. 12 shows schematically a partial sectional view of a luminous structure based on LEDs in an alternative form of the seventh embodiment of the invention.

FIG. 12 shows schematically a partial sectional view of a luminous structure 700' based on LEDs in an alternative form of the seventh embodiment of the invention.

This structure 700' differs from the structure 700 in the following way:
the LEDs 4' emit UV, for example UVA, radiation;
the layers 2'a, 2'b are chosen to transmit UVA sufficiently;
these layers are placed on the internal faces of thin UVA-transparent dielectric elements 91a, 91b, for example specific glass sheets already described above; and
phosphor coatings 92a, 92b emitting in the visible are deposited on the external faces of the elements 91a, 91b.

This structure may be dissymmetric (a single phosphor, etc.). The LEDs may also emit in the visible, and the coating(s) may serve to produce white light.

Figure 13:
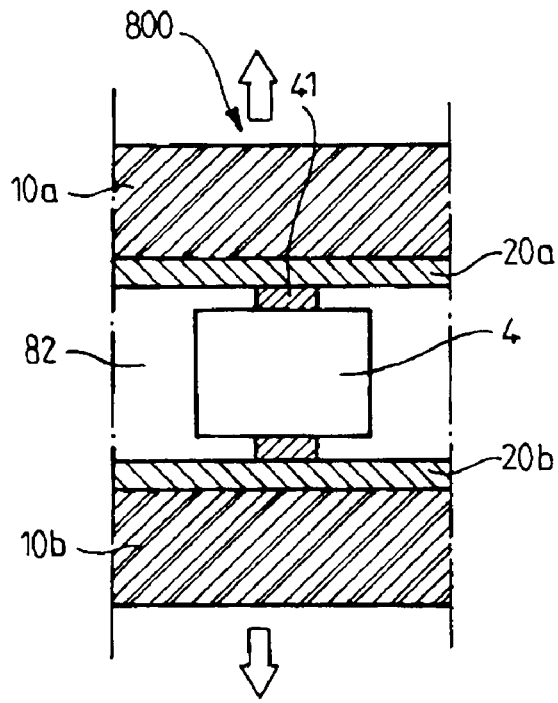
FIG. 13 shows schematically a partial sectional view of a luminous structure based on LEDs in an eighth embodiment of the invention.

FIG. 13 shows schematically a partial sectional view of the luminous structure 800 based on LEDs in an eighth embodiment of the invention.

This structure 800 comprises, in this order, vertically:
a first glass PET sheet 10a, or any other for example flexible dielectric substrate, this sheet bearing:
a first grid of conducting lines 20a as already described and
LEDs which are separated from each other by dielectric resin 82 and the first contact 41 of which is in direct connection with the grid 20a;
a second grid of conducting lines 20b, preferably similar to the first and in direct connection with the second contact 42; and
a second glass PET sheet 10b, or any other dielectric substrate.

Figure 14:
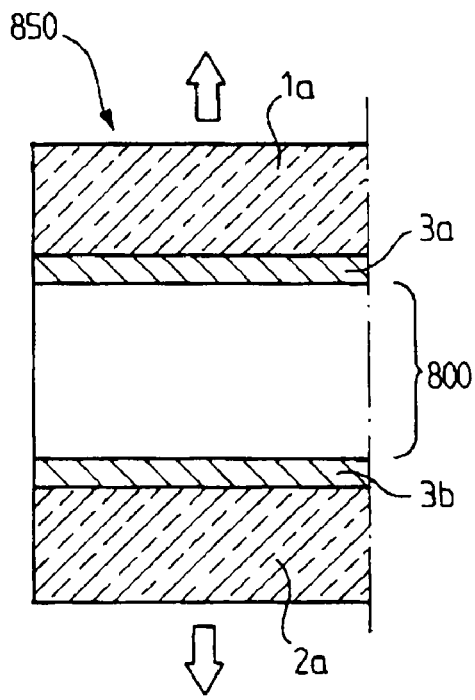
FIGS. 14 and 15 show schematically partial sectional views of a luminous structure based on LEDs in alternative forms of the seventh embodiment of the invention.

This structure may be sold alone, may be cut and/or, for greater strength, may be laminated between two glass sheets 1a, 1b with PVB sheets 3a, 3b, as shown in FIG. 14.

Figure 15:
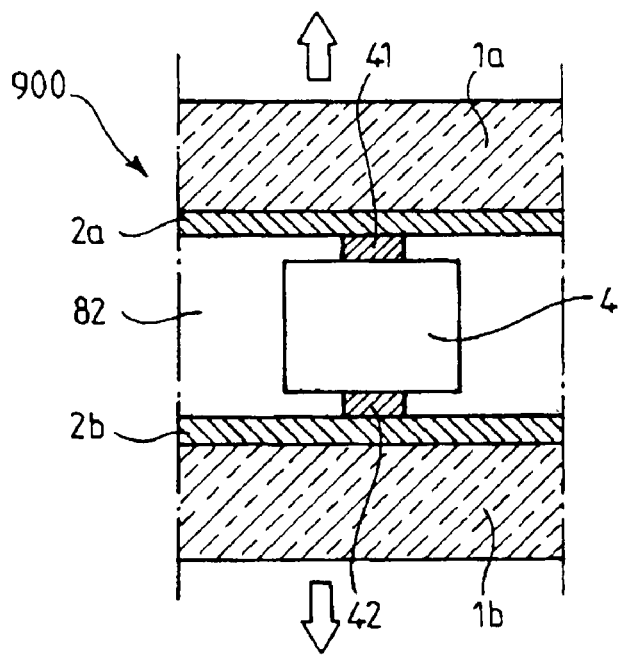

FIG. 15 shows schematically a partial sectional view of a luminous structure 900 based on LEDs in an alternative form of the seventh embodiment.

This structure 900 differs from the structure 800 in that the first and second PET sheets 10a, 10b are replaced with glass sheets 1a, 1b and/or the grids are replaced with transparent layers 2a, 2b.

Figure 16:
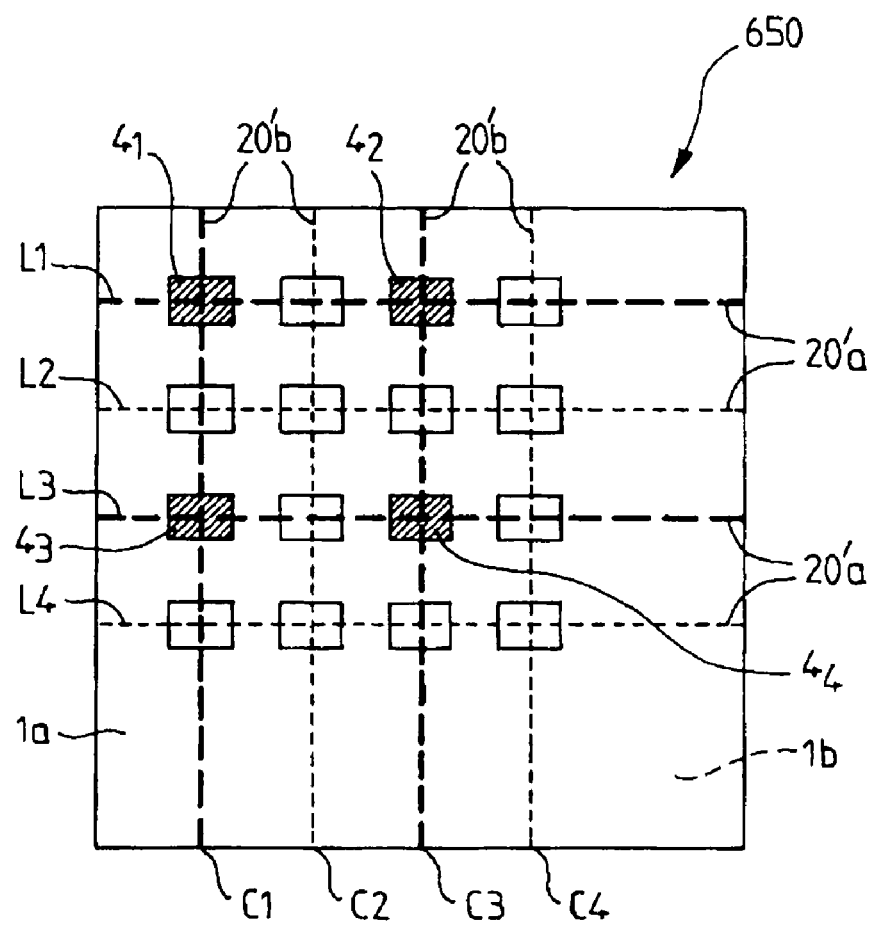
FIG. 16 shows schematically a partial view of a luminous structure based on LEDs capable of addressing the LEDs.

FIG. 16 shows a schematic top view of an LED-addressable luminous structure 650 based on LEDs.

This structure 650 is an alternative form of the structure 600 shown in FIG. 9.

The first glass sheet 1a includes, on its internal main face, a "first" grid 20'a of conducting lines L1 to L4 (or, as a variant, wires) that are parallel to the lateral edges, for example conducting lines obtained by inkjet printing, especially with a silver-based or copper-based ink.

The second glass sheet 1b includes, on its internal main face, a "second" grid 20'b of conducting lines C1 to C4 (or wires) that are parallel to the longitudinal edges, for example conducting lines obtained by inkjet printing.

Placed between the sealed glass sheets are LEDs with opposed contacts placed on the lines (or wires) of each grid 20'a, 20'b.

More precisely, independent drive means for each line or group of lines are provided in order for certain LEDs $4_1$, $4_2$, $4_3$, $4_4$ to be selectively turned on. In the example illustrated, the lines L1 and L3, C1 and C3 (shown in bold for this purpose) are supplied in order to turn on the LEDs $4_1$, $4_2$, $4_3$, $4_4$ (shown shaded) that are positioned at the intersections of these lines.

Moreover, these lines are placed and/or are sufficiently thin for overall transparency.

Likewise, each line may be replaced with two lines and the LEDs are on these lines. Moreover, the LEDs may be off-centre with respect to the intersections of the lines.

In an alternative form, the electrodes are formed from preferably transparent conducting strips separated by insulating strips, the conducting strips being parallel to the longitudinal edges in the case of the first grid and parallel to the lateral edges in the case of the second grid.

Figure 17:
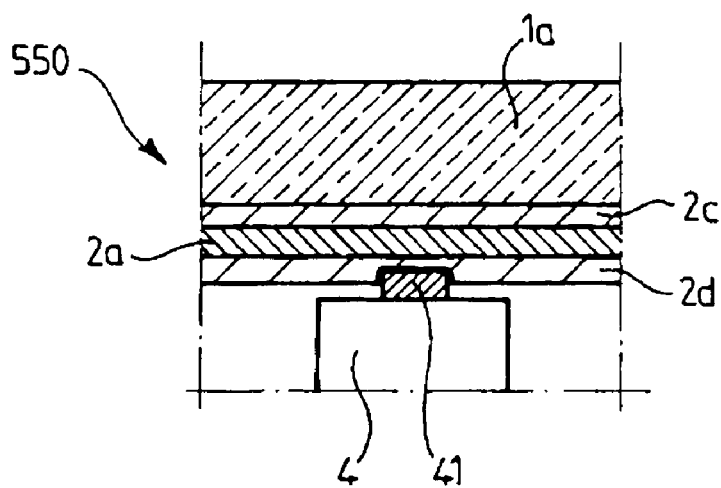
FIG. 17 shows schematically a partial sectional view of a luminous structure based on LEDs in a ninth embodiment of the invention.

FIG. 17 shows schematically a partial sectional view of a luminous structure 550 based on LEDs in another alternative form of the structure of the fifth embodiment of the invention shown in FIG. 9.

This structure 550 differs from the structure 500 in that the transparent layers 2a, 2b are thin functional conducting layers, especially made of metal, preferably silver, which are placed between thin dielectric layers 2c, 2d which are:
optionally, on the silver layer, a blocking layer based on a metal, metal alloy, or a substoichiometric oxide of a metal or metal alloy; and
a layer based on a metal oxide, for example an optionally aluminium-doped zinc oxide, and/or a layer of silicon nitride.

The thin dielectric layers 2d in this example are compressed at the contacts 41 on the chip 4.

Of course, this type of multilayer may be used in alternative forms of other embodiments.

In all the embodiments, conductive adhesive may be provided between the contacts and the associated electrodes.

The invention claimed is:

1. A luminous structure, comprising:
a first dielectric element with a substantially plane main face associated with a first electrode;
a second dielectric element with a substantially plane main face associated with a second electrode that faces the first electrode and lies in a different plane; and
at least a first light-emitting diode (LED) including a semiconductor chip,
wherein a first electrical contact is disposed on a first face of the semiconductor chip and is electrically connected to the first electrode, the second electrical contact is disposed on a second face of the semiconductor chip and is electrically connected to the second electrode, the first and second faces of the semiconductor chip are opposed faces, and at least the first dielectric element is configured to at least partly transmit radiation within the ultraviolet or in the visible, and the semiconductor chip is configured to emit light via the first and second faces of the semiconductor chip.

2. The luminous structure according to claim 1, wherein the first electrical contact is electrically connected directly to the first electrode, and the second electrical contact is electrically connected directly to the second electrode.

3. The luminous structure according to claim 1, wherein the first electrical contact is at least one layer, and the second electrical contact is at least one layer.

4. The luminous structure according to claim 1, wherein the first LED is free of an envelope encapsulating the chip, and the first LED includes the chip.

5. The luminous structure according to claim 1, wherein the first LED includes a partial protective envelope leaving the first and second contacts free.

6. The luminous structure according to claim 1, further comprising:

current leads that are coupled to the first and second electrodes and that are screen-printed conducting strips.

7. The luminous structure according to claim 2, further comprising:

means for maintaining at least one of the direct connections between the first and second electrodes and the first and second electrical contacts, respectively.

8. The luminous structure according to claim 7, wherein the connection-maintaining means include means for applying controlled pressure on at least one of the main faces.

9. The luminous structure according to claim 1, further comprising:

at least one elastic and/or flexible electrically conducting part placed between the first electrical contact and the first electrode to permanently maintain at least the first electrical connection, and wherein the part includes a spring or a flexible tab folded at least into two.

10. The luminous structure according to claim 1, wherein at least one of the first and second electrodes includes a conducting layer distributed over or substantially covering the associated main face.

11. The luminous structure according to claim 1, further comprising:

a thin conducting metallic low-emissivity and/or solar-protection layer covered with one or more thin dielectric layers and inserted between dielectric layers, the thin conducting layer at least partly forming one of the first and second electrodes.

12. The luminous structure according to claim 1, wherein at least one of the first and second electrodes includes a conducting grid made up of linear elements and substantially occupying the associated main face.

13. The luminous structure according to claim 1, wherein at least one of the first and second electrodes includes a conducting grid of conducting wires that are partially integrated into the associated main face.

14. The luminous structure according to claim 1, further comprising:

at least a second LED, and wherein the second LED is in a reverse position with respect to the first LED.

15. The luminous structure according to claim 1, further comprising:

a plurality of LEDs and means for driving the LEDs to emit radiation either permanently or intermittently, and either of a given color or of different colors, or to address the LEDs.

16. The luminous structure according to claim 1, wherein each of the first and second electrodes include a grid of conducting elements along a given orientation, the grids forming, in projection, a mesh.

17. The luminous structure according to claim 1, further comprising:

a plurality of LEDs, and wherein the LEDs are assembled on one or more coplanar conducting supports, making up part of or forming one of the first or second electrodes and being thin and/or extending beyond the associated main face.

18. The luminous structure according to claim 1, further comprising:

a plurality of first coplanar dielectric elements carrying first electrodes and with a plurality of first LEDs, the first dielectric elements being associated with a glass substrate.

19. The luminous structure according to claim 1, wherein at least one of the first and second dielectric elements includes a glass element.

20. The luminous structure according to claim 1, wherein at least one of the first and second dielectric elements includes a sheet of glass, or a sheet of clear or extra clear soda-lime-silica glass.

21. The luminous structure according to claim 1, wherein the luminous structure is substantially a mineral structure.

22. The luminous structure according to claim 1, wherein at least one of the first and second dielectric elements includes polymeric film, or a PET film.

23. The luminous structure according to claim 1, wherein at least one of the first and second dielectric elements includes an adhesive or a lamination interlayer.

24. The luminous structure according to claim 1, wherein a portion bounded by the first dielectric element and the second dielectric element forms a substantially laminated portion.

25. The luminous structure according to claim 1, wherein the first and second dielectric elements are kept a substantially constant distance apart and define an internal space filled with a dielectric and incorporating the first LED.

26. The luminous structure according to claim 25, wherein the internal space is under a low vacuum.

27. The luminous structure according to claim 25, wherein the dielectric includes a resin.

28. The luminous structure according to claim 1, wherein the first LED is placed in a through-hole of a solid third dielectric element inserted between the first and second dielectric elements.

29. The luminous structure according to claim 28, further comprising:

at least a second LED and placed in the hole.

30. The luminous structure according to claim 28, wherein the third dielectric element includes a lamination interlayer.

31. The luminous structure according to claim 1, further comprising:

at least one phosphor coating associated with one of the first and second dielectric elements, and wherein radiation excites the phosphor.

32. The luminous structure according to claim 1, wherein the structure is substantially transparent outside a LED zone.

33. The luminous structure according to claim 1, further comprising:

a receiver diode that receives control signals for remotely controlling the first LED.

34. The luminous structure according to claim 1, wherein the luminous structure forms an illuminating, decorative, architectural, display, or indicating glazing.

35. A luminous structure, comprising:
a first dielectric element with a substantially plane main face associated with a first electrode;
a second dielectric element with a substantially plane main face associated with a second electrode that faces the first electrode and lies in a different plane; and
at least a first light-emitting diode (LED) including a semiconductor chip,
wherein a first electrical contact is disposed on a first face of the semiconductor chip and is electrically connected to the first electrode, the second electrical contact is disposed on a second face of the semiconductor chip and is electrically connected to the second electrode, the first and second faces of the semiconductor chip are opposed faces, and at least the first dielectric element is configured to at least partly transmit radiation within the ultraviolet or in the visible, and
the first LED includes a partial protective envelope leaving the first and second contacts free.

36. A luminous structure, comprising:
a first dielectric element with a substantially plane main face associated with a first electrode;
a second dielectric element with a substantially plane main face associated with a second electrode that faces the first electrode and lies in a different plane;
at least a first light-emitting diode (LED) including a semiconductor chip; and
at least one elastic and/or flexible electrically conducting part placed between the first electrical contact and the first electrode to permanently maintain at least the first electrical connection,
wherein a first electrical contact is disposed on a first face of the semiconductor chip and is electrically connected to the first electrode, the second electrical contact is disposed on a second face of the semiconductor chip and is electrically connected to the second electrode, the first and second faces of the semiconductor chip are opposed faces, and at least the first dielectric element is configured to at least partly transmit radiation within the ultraviolet or in the visible, and
the at least one elastic and/or flexible electrically conducting part is a spring or a flexible tab folded at least into two.

37. A luminous structure, comprising:
a plurality of first coplanar dielectric elements carrying first electrodes and with a plurality of first light-emitting diodes, the first dielectric elements being associated with a glass substrate;
a second dielectric element with a substantially plane main face associated with a second electrode that faces one of the first electrodes and lies in a different plane; and
the plurality of first light-emitting diodes each including a semiconductor chip,
wherein a first electrical contact is disposed on a first face of one of the semiconductor chips and is electrically connected to one of the first electrodes, the second electrical contact is disposed on a second face of the one of the semiconductor chips and is electrically connected to the second electrode, the first and second faces of the one semiconductor chip are opposed faces, and each first dielectric elements are configured to at least partly transmit radiation within the ultraviolet or in the visible.

38. A luminous structure, comprising:
a first dielectric element with a substantially plane main face associated with a first electrode;
a second dielectric element with a substantially plane main face associated with a second electrode that faces the first electrode and lies in a different plane;
at least a first light-emitting diode (LED) including a semiconductor chip; and
at least a second LED,
wherein a first electrical contact is disposed on a first face of the semiconductor chip and is electrically connected to the first electrode, the second electrical contact is disposed on a second face of the semiconductor chip and is electrically connected to the second electrode, the first and second faces of the semiconductor chip are opposed faces, and at least the first dielectric element is configured to at least partly transmit radiation within the ultraviolet or in the visible,
the first LED is placed in a through-hole of a solid third dielectric element inserted between the first and second dielectric elements, and
the at least second LED is placed in the hole.

39. A luminous structure, comprising:
a first dielectric element with a substantially plane main face associated with a first electrode;
a second dielectric element with a substantially plane main face associated with a second electrode that faces the first electrode and lies in a different plane;
at least a first light-emitting diode (LED) including a semiconductor chip; and
a receiver diode that receives control signals for remotely controlling the first LED,
wherein a first electrical contact is disposed on a first face of the semiconductor chip and is electrically connected to the first electrode, the second electrical contact is disposed on a second face of the semiconductor chip and is electrically connected to the second electrode, the first and second faces of the semiconductor chip are opposed faces, and at least the first dielectric element is configured to at least partly transmit radiation within the ultraviolet or in the visible.

* * * * *